United States Patent
Casper et al.

(10) Patent No.: US 7,403,053 B2
(45) Date of Patent: Jul. 22, 2008

(54) POWER SUPPLY DEPENDENT DELAY COMPENSATION

(75) Inventors: Bryan K. Casper, Hillsboro, OR (US); Stephen R. Mooney, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 939 days.

(21) Appl. No.: 10/325,605

(22) Filed: Dec. 19, 2002

(65) Prior Publication Data

US 2004/0120437 A1    Jun. 24, 2004

(51) Int. Cl.
*H03L 7/06* (2006.01)
(52) U.S. Cl. .................. 327/149; 327/158
(58) Field of Classification Search .......... 327/149, 327/153, 158, 161, 163, 183; 331/17, 25; 375/373–376
See application file for complete search history.

(56) References Cited

U.S. PATENT DOCUMENTS

| | | | | |
|---|---|---|---|---|
| 5,438,550 A | * | 8/1995 | Kim | 365/233.5 |
| 5,600,599 A | * | 2/1997 | Nakayama et al. | 365/189.05 |
| 5,659,472 A | * | 8/1997 | Nishino et al. | 701/41 |
| 6,229,364 B1 | * | 5/2001 | Dortu et al. | 327/158 |
| 6,556,489 B2 | * | 4/2003 | Gomm et al. | 365/194 |
| 6,583,610 B2 | * | 6/2003 | Groom et al. | 323/288 |
| 6,693,473 B2 | * | 2/2004 | Alexander et al. | 327/158 |
| 6,911,853 B2 | * | 6/2005 | Kizer et al. | 327/158 |
| 2002/0067153 A1 | * | 6/2002 | Fletcher et al. | 323/201 |

* cited by examiner

*Primary Examiner*—N. Drew Richards
*Assistant Examiner*—Ryan C Jager
(74) *Attorney, Agent, or Firm*—Schwegman, Lundberg & Woessner, P.A.

(57) ABSTRACT

An integrated circuit compensates for power supply voltage dependent delay using a clock circuit that is responsive to a power supply voltage measuring circuit. The clock circuit modifies a phase relationship based on a measured power supply voltage value.

16 Claims, 5 Drawing Sheets

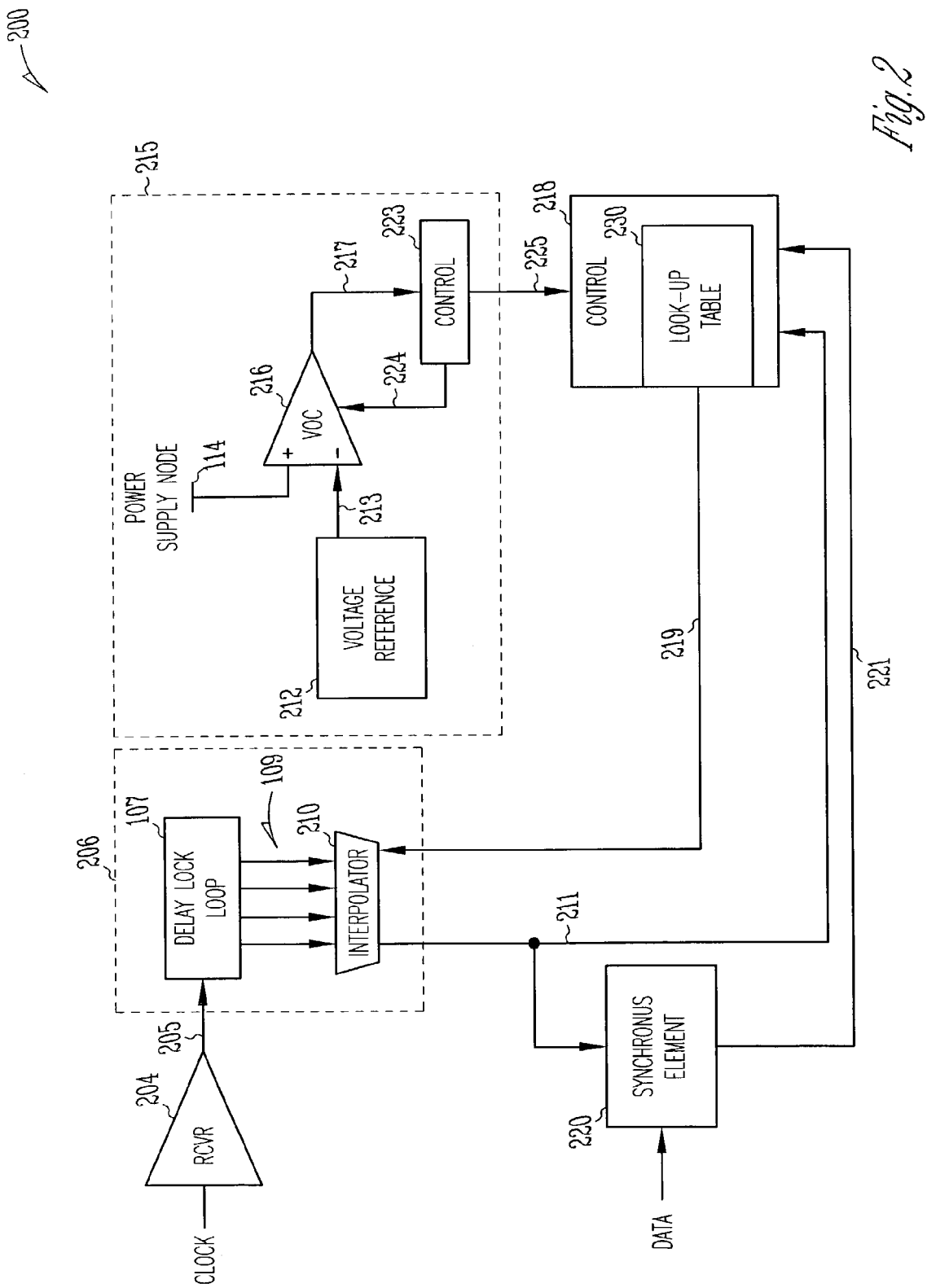

POWER SUPPLY DEPENDENT DELAY COMPENSATION

FIELD

The embodiments of the present invention relates generally to integrated circuits, including integrated circuits with delay compensation.

BACKGROUND

Integrated circuits typically have dedicated interface circuits to communicate with other integrated circuits and other systems. Signals that travel from one integrated circuit to another or within an integrated circuit are becoming faster and faster. As signal speeds increase, the effect of "phase jitter" becomes more pronounced. "Phase jitter," for the purposes of this description, refers to any variation in the phase of one or more signals. For example, clock signals, data signals, or other signals may exhibit phase jitter. Many possible sources of phase jitter exist. For example, phase jitter may be caused by an imperfect source for a system clock signal, varying amounts of delay in a signal path, power fluctuations or may be caused by slight variations in transistors within an integrated circuit.

For the reasons stated above, and for other reasons stated below which will become apparent to those skilled in the art upon reading and understanding the present specification, there is a need in the art for alternate integrated circuit interfaces and correction of phase jitter.

BRIEF DESCRIPTION OF THE DRAWINGS

FIG. 2 shows a portion of an integrated circuit;

DESCRIPTION OF EMBODIMENTS

Figure 1A:
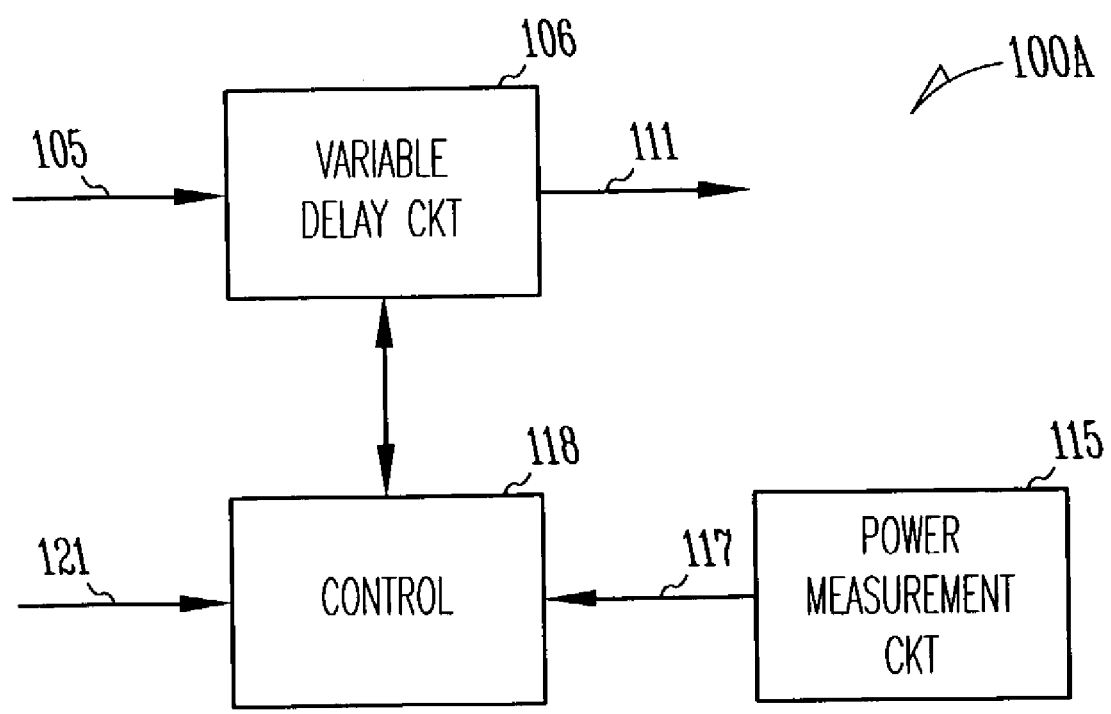
FIG. 1A shows an electronic system having a power signal dependent, variable delay.

In the following detailed description, reference is made to the accompanying drawings that show, by way of illustration, specific embodiments in which the embodiments of the invention may be practiced. These embodiments are described in sufficient detail to enable those skilled in the art to practice the embodiments of the invention. It is to be understood that the various embodiments of the invention, although different, are not necessarily mutually exclusive. For example, a particular feature, structure, or characteristic described herein in connection with one embodiment may be implemented within other embodiments without departing from the scope of the invention. In addition, it is to be understood that the location or arrangement of individual elements within each disclosed embodiment may be modified without departing from the scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

FIG. 1A shows an integrated circuit system 100A that includes a variable delay circuit 106, a power measurement circuit 115, and a control 118. A signal on node 105 is input to the variable delay circuit 106. This signal on node 105 is a signal that may experience a delay or phase shift as the signal propagates in the integrated circuit system 100A. In an embodiment, the signal on node 105 is a clock signal. Variable delay circuit 106 as shown is a clock circuit that receives the signal on node 105 and produces a delayed signal, shown at 111. Variable delay circuit 106, in an embodiment, includes a digital circuit. Variable delay circuit 106, in an embodiment, includes an analog circuit. Power supply measurement circuit 115 adapted to measure fluctuations in the power supply of integrated circuit 100A and adapted to supply a signal 117 dependent on the measured power supply fluctuations to controller 118. Controller 118 is adapted to produce a control information based on signal 117. The control information is adapted to influence operation of variable delay circuit 106. Controller 118 is adapted to send the control information to variable delay circuit 106. Circuit 106 produces delayed signal 111 for use in the integrated circuit system 10A. Accordingly, system 100A corrects for phase shifts in signals propagating in the system 100A or in other systems using same signal 105. Other systems that include integrated circuit 100A include clock distribution networks and other clock dependent digital circuits.

Figure 1B:
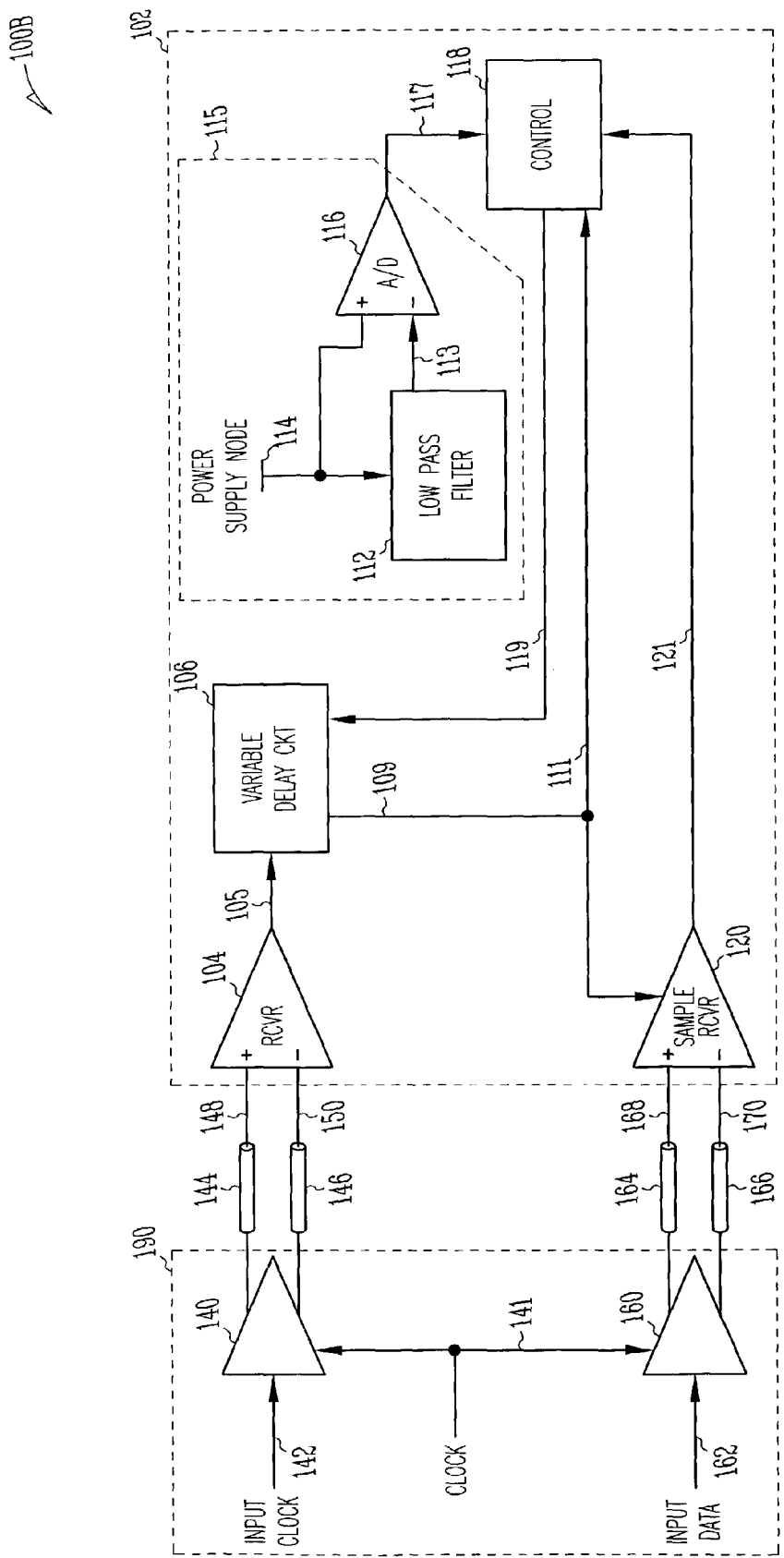
FIG. 1B shows an electronic system having two interconnected integrated circuits and a power signal dependent, variable delay.

FIG. 1B shows an electronic system having two interconnected integrated circuits. System 100B includes integrated circuits 102 and 190 interconnected by conductors 144, 146, 164, and 166. In the embodiments represented by FIG. 1B, conductors 144, 146, 164, and 166 are transmission lines that provide signal paths, or "channels" between integrated circuits 190 and 102. Integrated circuit 190 drives signals on conductors 144, 146, 164, and 166, and integrated circuit 102 receives signals on conductors 144, 146, 164, and 166. For simplicity, two pairs of conductors are shown interconnecting integrated circuits 190 and 102. In some embodiments, a bus is formed from multiple pairs of conductors between integrated circuits 190 and 102.

Conductors 144, 146, 164, and 166 form two high-speed unidirectional signal paths between integrated circuits 190 and 102. In other embodiments, conductors 144, 146, 164, and 166 form a high-speed bi-directional data path. In embodiments represented by FIG. 1B, integrated circuit 190 transmits a clock signal on conductors 144 and 146, and also transmits a data signal on conductors 164 and 166. The clock signal and data signal are differential signals, each transmitted in two conductors. In other embodiments, the clock and data signals are single-ended signals, and the number of conductors is reduced by a factor of two.

System 100B includes an example of a source-synchronous communication link in which the clock and data driver strobes are in phase. Integrated circuit 190 includes drivers 140 and 160. Driver 140 is driven by an input clock signal on node 142, and is clocked, or "strobed," by a clock on node 141. Driver 160 is driven by an input data signal on node 162 and, like driver 140, is strobed by the clock signal on node 141. Because drivers 140 and 160 are both strobed by the same clock signal on node 141, they are said to be strobed "in phase." Driver 140 drives conductors 144 and 146 with the input clock signal received on node 142. Conductors 144 and 146 are coupled to integrated circuit 102 at ports 148 and 150, respectively. Driver 160 drives conductors 164 and 166 with the input data signal received on node 162. Conductors 164 and 166 are coupled to integrated circuit 102 at ports 168 and 170, respectively.

As described above, the input clock signal and input data signal are strobed in phase in integrated circuit 190. As the input clock signal and input data signal leave integrated circuit 190 and enter integrated circuit 102, they are subjected to varying delays as a result of many factors, including variations in power supply voltage. Various elements depicted in system 100B interoperate to compensate for supply dependent delay variation (phase jitter) of signal paths, including the clock path and the data path. The various elements that interoperate to compensate for power supply voltage dependent delay variations are described below.

Integrated circuit 102 includes receiver (RCVR) 104, variable delay circuit 106, power supply voltage measuring circuit 115, control circuit 118, and sampled receiver 120. Integrated circuit 102 may also include many other types and variations of circuits, which are omitted in FIG. 1B for the sake of clarity. Receiver 104 is coupled to ports 148 and 150, and receives a clock signal from conductors 144 and 146. Receiver 104 produces a delayed replica of the clock signal on node 105. Variable delay circuit 106 as shown is a clock circuit that receives the clock signal on node 105 and produces a delayed clock signal, shown at 109. Variable delay circuit 106, in an embodiment, includes a digital circuit. Variable delay circuit 106, in an embodiment, includes an analog circuit. Circuit 106 produces delayed clock signal 109 in response to control information received on node 119. Delayed clock signal 109 is provided to node 111, which in turn is connected to sample receiver 120 and controller 118.

Sampled receiver 120 receives the clock signal on node 111. Sampled receiver 120 clocks the data signal received from conductors 164 and 166, and produces a data signal on node 121. Sampled receiver 120 is shown in FIG. 1B as a differential receiver that receives a differential signal on two nodes. In some embodiments, sampled receiver 120 is a single ended receiver that receives a single ended signal on one node.

Power supply voltage measuring circuit 115 includes lowpass filter 112 and analog-to-digital converter (A/D) 116. A/D 116 receives a power supply voltage value on node 114 and a second voltage value on node 113. In some embodiments, power supply node 114 is a power supply node corresponding to the power supply for integrated circuit 102. For example, in some embodiments, power supply node 114 is directly coupled to the main source of power for integrated circuit 102. In other embodiments, power supply node 114 is a node derived from the main source of power for integrated circuit 102. For example, receivers 104 and 120 may operate from a power supply separate from the remainder of integrated circuit 102, and power supply node 114 may correspond to the power supply for receivers 104 and 120.

Low pass filter 112 is coupled between power supply node 114 and node 113. Low pass filter 112 produces a voltage value on node 113 that substantially corresponds to the direct current (DC) voltage component present on power supply node 114. A/D 116 samples and digitizes the difference of the voltages on nodes 113 and 114 to produce a digital value that represents an instantaneous voltage value or a voltage variation value. A/D 116 provides the voltage variation value to control circuit 118 on node 117. FIG. 1B shows node 117 as a single line for clarity. In many embodiments, node 117 includes many physical signal lines. For example, node 117 may include four physical signal lines, and A/D 116 may provide four bit digital words to control circuit 118. Node 117 may also include more or less than four physical signal lines.

In other embodiments, node 117 may include a single line, and A/D 116 may provide digital data serially to control circuit, 118.

Control circuit 118 produces control information on node 119 to influence the operation of clock circuit 106. For example, control circuit 118 may include a state machine that operates to shift the phase of the incoming clock signal by substantially 90 degrees so that the clock will cause sampled receiver 120 to sample the incoming data at the center of a bit cell. Control circuit 118 also performs as part of a feedback circuit. A feedback circuit is formed by control circuit 118, interpolator 110, and sampled receiver 120. In some embodiments, control circuit 118 sets interpolator 110 to an initial value, and then modifies this value in response to data on node 121. For example, control circuit 118 may include a state machine that varies the phase offset of the clock back and forth while monitoring the data value on node 121. Control circuit 118 may then modify the control information on node 119 in response to the combination of phase settings and the data value.

Control circuit 118 may include any type of control circuitry capable of performing actions described herein. For example, control circuit 118 may include a processor or a state machine. Control circuit 118 may also include a memory mapped interface such that a processor external to integrated circuit 102 can cause control circuit 118 to perform the actions described herein.

In some embodiments, control circuit 118 performs actions in two different modes: a "training mode" and a "normal mode." During training mode, a known training data pattern (possibly alternating data) is transmitted from integrated circuit 190 and control circuit 118 sets the control information on node 119 to a nominal value. This clock on node 111 is then used to sample the data at sampled receiver 120. Control circuit 118 modifies the control information on node 119, or "sets the interpolator value" such that sampled receiver 120 captures the alternating data edges. The pole of the low pass filter 112 is set at a frequency below the dominant power supply noise frequency. The voltage at the input of A/D 116 then corresponds to the noise on the power supply minus the DC component. In some embodiments, a lookup table that relates power supply noise to relative interpolator settings is built during the training mode. This may be accomplished by taking multiple samples from the output of A/D 116 and associating those values to the interpolator phase setting.

During normal mode, control circuit 118 shifts the interpolator setting by 90 degrees in addition the compensated phase value to properly sample in the middle of the bit cell. In embodiments that include a lookup table, the compensated phase value may be determined by sampling the output of A/D 116 and indexing the power supply noise value in the lookup table. Example embodiments that include a lookup table are described with reference to FIG. 2, below.

In some embodiments, system 100B enters training mode when the system is powered on. In some embodiments, system 100B periodically enters training mode and performs the actions described above. In these embodiments, system 100B periodically updates the algorithm used to set interpolator 110, or periodically updates the contents of a lookup table used for the same purpose. In other embodiments, system 100B enters training mode in response to external stimuli, such as a reset signal, or a training signal (not shown). Any mechanism may be used to cause system 100B to enter training mode and to cause system 100B to determine a control algorithm or lookup table contents.

Integrated circuits 190 and 102 can be any type of integrated circuits capable of including drivers and receivers as shown. For example, either integrated circuit can be a processor such as a microprocessor, a digital signal processor, a microcontroller, or the like. Integrated circuits 190 and 102 can also be integrated circuits other than a processor such as an application-specific integrated circuit (ASIC), a communications device, a memory controller, or a memory such as a dynamic random access memory (DRAM).

Figure 1C:
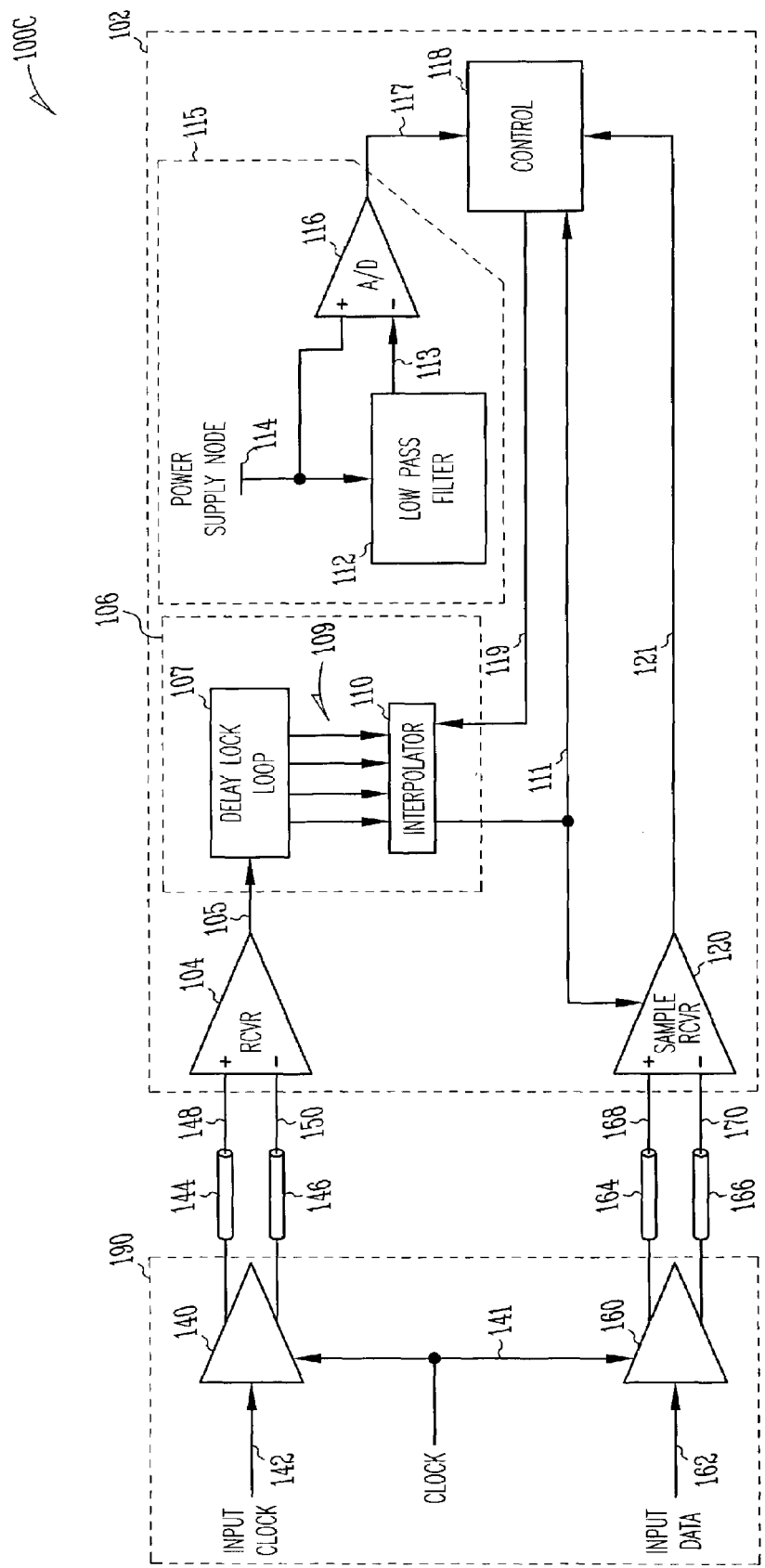
FIG. 1C shows an electronic system having two interconnected integrated circuits a power signal dependent, variable delay.

FIG. 1C shows an electronic system 100C having two interconnected integrated circuits. System 100C is generally similar to system 100B described above except variable delay circuit 106 includes delay lock loop 107 and interpolator 110. Delay lock loop 107 receives the clock signal on node 105 and produces multiple clock signals having various phase relationships, shown at 109. Interpolator 110 produces a clock signal on node 111 in response to the various clock signals shown at 109, and also in response to control information received on node 119.

In some embodiments, interpolator 110 includes current source circuits corresponding to each of the various clock signals shown at 109, and currents from the various current source circuits are mixed in response to control information on node 119 to produce the resulting clock signal on node 111. In other embodiments, interpolator 110 operates as a multiplexer to select one of the various clock signals shown at 109 in response to control information on node 119.

FIG. 2 shows a portion of an integrated circuit. Integrated circuit 200 includes receiver (RCVR) 204, synchronous element 220, clock circuit 206, power supply voltage measuring circuit 215, and control circuit 218. Receiver 204 receives a single-ended clock signal, and synchronous element 220 receives a single-ended data signal. In contrast to systems 10B, 100C (FIGS. 1B and 1C), data and clock signals received by integrated circuit 200 do not necessarily have a predefined phase relationship. In some embodiments, the clock and data signals are source-synchronous (as in systems 100B and 100C), and in other embodiments, the relationship between the clock and data signals varies over time.

Clock circuit 206 includes delay lock loop 107 and interpolator 210. Delay lock loop 107 is the same as that shown in FIG. 1C. Interpolator 210 is a device that can select one of many different clock signals shown at 109, or may interpolate between the phases of the various clock signals shown at 109 to produce the clock signal on node 211.

Power supply voltage measuring circuit 215 includes variable offset comparator (VOC) 216, control circuit 223, voltage reference 212, and power supply node 114. Voltage reference 212 produces a substantially constant voltage on node 213. Variable offset comparator 180 receives voltages on nodes 213 and 114, and compares the differential amplitude to an offset. The offset is programmable, or "variable." In embodiments represented by FIG. 2, the offset of VOC 216 is controlled by control circuit 223. Control circuit 223 sets the variable offset of VOC 216 by varying the value of signals on node 224. In some embodiments, node 224 is a single physical conductor that carries an analog signal to control the offset of VOC 216. In other embodiments, node 224 includes multiple physical conductors that carry a digital signal to control the offset of VOC 216.

The combination of VOC 216 and control circuit 223 can measure the difference between the voltages on nodes 114 and 213 by varying the offset of VOC 216 until a digital signal on node 217 changes state. Control circuit 223 receives the signal on node 217, and provides control circuit 218 with an indication of the offset or the difference between the voltages on nodes 114 and 213.

Embodiments represented by FIG. 2 include a variable offset comparator and a control mechanism to determine the power supply voltage variation. This is in contrast to embodiments represented by FIGS. 1B and 1C in which the power supply voltage variation is determined with an A/D. Any embodiment herein described as using an A/D may also use a VOC, and any embodiment herein described as using a VOC may also use an A/D.

Control circuit 218 includes lookup table 230. In embodiments represented by FIG. 2, lookup table 230 includes a table of values that relate power supply variation values to interpolator settings for interpolator 210. Control circuit 218 may include a state machine, a processor, or any other circuitry capable of providing the operations described. In some embodiments, a portion of control circuit 218 includes a processor interface to allow access by a processor external to integrated circuit 200. For example, control circuit 218 may include a memory mapped processor interface that allows an external processor to address integrated circuit 200 as a memory mapped peripheral device.

Figure 3:
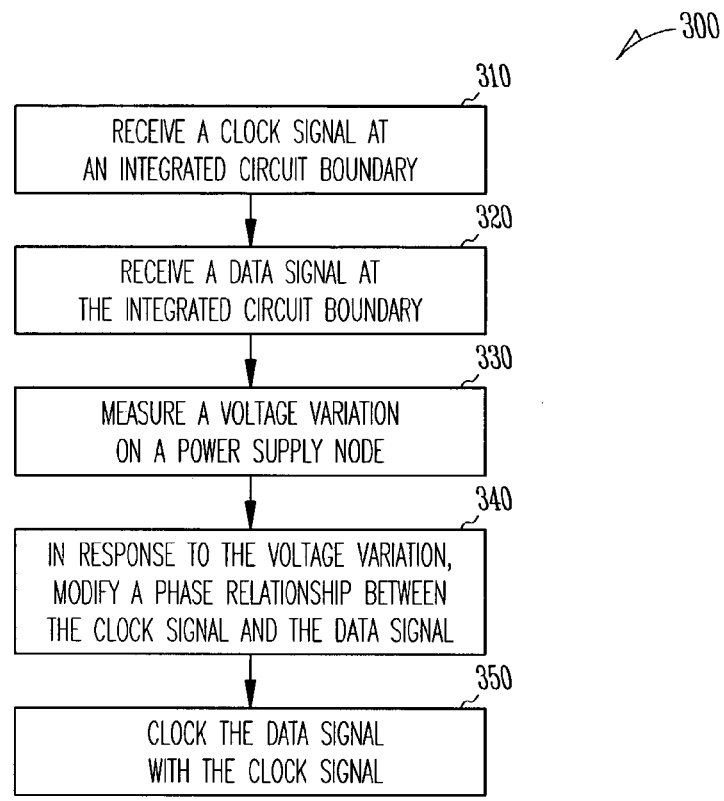
FIG. 3 shows a flowchart in accordance with various embodiments of the present invention.
Figure 4:
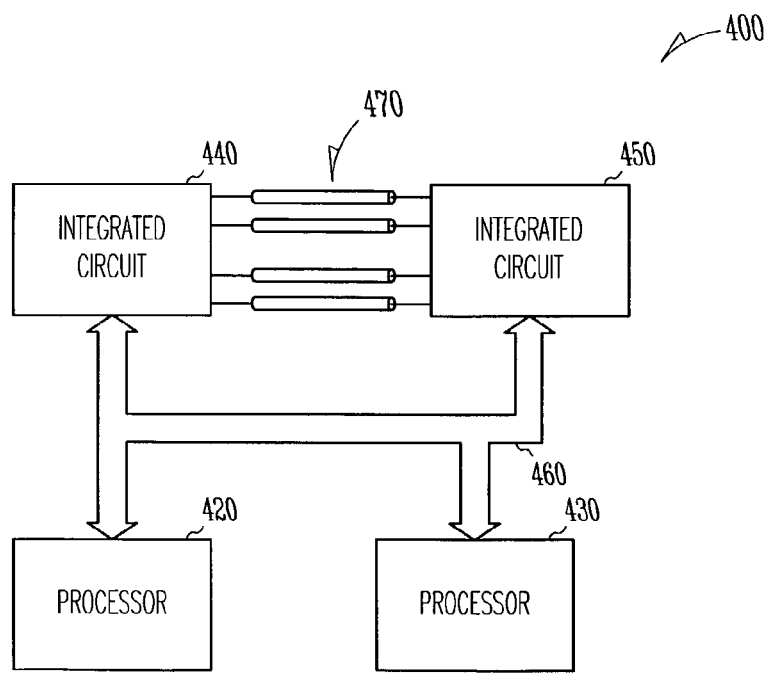
FIG. 4 shows an electronic system that includes a processor.

FIG. 3 shows a flowchart in accordance with various embodiments of the present invention. In some embodiments, method 300, or portions thereof, is performed by a processor such as processor 420 (FIG. 4, described below). In other embodiments, method 300 is distributed across multiple processors or controllers. For example, portions of method 300 may be performed by processor 320 (FIG. 3) while other portions of method 300 may be performed by control circuit 118 (FIGS. 1A, 11B, or 1C) or control circuit 218 (FIG. 2). The various actions in method 300 may be performed in the order presented, or may be performed in a different order. Further, in some embodiments, some actions listed in FIG. 3 are omitted from method 300.

Method 300 is shown beginning with block 310 in which a clock signal is received at an integrated circuit boundary. In block 320, a data signal is received at the integrated circuit boundary. The integrated circuit boundary referred to in blocks 310 and 320 may correspond to ports 148, 150, 168, and 170 at the boundary of integrated circuit 102 (FIGS. 1B and 1C). The integrated circuit boundary may also correspond to the boundaries of integrated circuits 440 and 450 (FIG. 4, below).

At 330, a voltage variation on a power supply node is measured. In some embodiments, this corresponds to measuring a difference between an instantaneous power supply voltage value and a filtered power supply voltage value. For example, referring now back to FIGS. 1B and 1C, an instantaneous power supply voltage value exists on power supply node 114, and a filtered power supply voltage value exists on node 113. A/D 116 measures the difference between the instantaneous power supply voltage value and the filtered power supply voltage value and produces a digital word on node 117.

At 340, a phase relationship between the clock signal and the data signal is modified in response to the voltage variations measured at 330. For example, as shown in FIGS. 11B and 1C, control circuit 118 influences clock circuit 106 to modify a phase of an incoming clock signal using information on node 119. In some embodiments, modifying the phase relationship is accomplished by selecting one of a plurality of clock signals having various phases. In other embodiments, modifying the phase relationship is accomplished by interpolating between various phases to arrive at a clock signal having an interpolated phase.

At 350, the data signal is clocked with the clock signal. Any type of synchronous element can be used to clock the data signal. For example, as shown in FIG. 2, a synchronous element such as a flip-flop or a latch can be used to receive the data signal. Also for example, as shown in FIGS. 1B and 1C, a sampled receiver having a differential input may be used to receive the data signal.

FIG. 4 shows a system diagram in accordance with various embodiments of the present invention. System 400 includes processor 420, memory 430, and integrated circuits 440 and 450 coupled by conductors 470. Integrated circuits 440 and 450 can by any of the integrated circuit embodiments previously described, or equivalents thereof. For example, either or both integrated circuits 440 and 450 can be a processor such as a microprocessor, a digital signal processor, a microcontroller, or the like. Integrated circuits 440 or 450 can also be an integrated circuit other than a processor such as an application-specific integrated circuit (ASIC), a communications device, a modem, a testing device, a network router, a memory controller, or a memory such as a dynamic random access memory (DRAM).

Processor 420 is coupled to integrated circuits 440 and 450 by bus 460. In some embodiments, processor 420 receives information on bus 460 that represents received signal amplitudes, and processor 420 may perform calculations based on that information. For example, processor 420 may perform actions associated with control circuit 118 (FIGS. 1A, 1B or 1C). Also for example, processor 420 may perform all or a subset of the actions listed in method 300 (FIG. 3). Also in some embodiments, processor 420 provides control information to integrated circuits 440 and 450. For example, in some embodiments of the present invention, processor 420 provides interpolator control information associated with control circuit 118 (FIG. 1C), or control circuit 218 (FIG. 2). Processor 420 can be any type of processor including, but not limited to, a microprocessor, a microcontroller, a digital signal processor, or the like. Also for example, processor 420 may be a hardware controller or a collection of hardware controllers that perform specific tasks.

Memory 430 represents an article that includes a machine-accessible medium. For example, memory 430 may represent any one or more of the following: a hard disk, a floppy disk, random access memory (RAM), read only memory (ROM), flash memory, CDROM, or any other type of article that includes a medium readable by a machine. Memory 430 may store instructions for performing the execution of the various method embodiments of the present invention. Memory 430 may also include data describing the current state of system 400.

Systems represented by the various foregoing figures can be of any type. Examples of represented systems include computers (e.g., desktops, laptops, handhelds, servers, Web appliances, routers, etc.), wireless communications devices (e.g., cellular phones, cordless phones, pagers, personal digital assistants, etc.), computer-related peripherals (e.g., printers, scanners, monitors, etc.), entertainment devices (e.g., televisions, radios, stereos, tape and compact disc players, video cassette recorders, camcorders, digital cameras, MP3 (Motion Picture Experts Group, Audio Layer 3) players, video games, watches, etc.), digital devices and the like.

Although the embodiments of the present invention have been described in conjunction with certain embodiments, it is to be understood that modifications and variations may be resorted to without departing from the scope of the invention as those skilled in the art readily understand. Such modifications and variations are considered to be within the scope of the invention and the appended claims.

What is claimed is:

1. A method comprising:
   measuring a voltage variation on a power supply node using a power supply voltage measuring circuit including an analog-to-digital converter, wherein measuring the voltage variation comprises measuring a difference between an instantaneous power supply voltage value and a filtered power supply voltage value; and
   in response to the voltage variation, modifying a phase relationship between a clock signal on a first signal path and a second signal on a second signal path wherein modifying the phase relationship includes modifying a phase relationship between the clock signal and a data signal.

2. The method of claim 1 wherein measuring the voltage variation comprises digitizing a power supply voltage on the power supply node.

3. A method comprising:
   measuring a voltage variation on a power supply node using a power supply voltage measuring circuit including an analog-to-digital converter; and
   in response to the voltage variation, modifying a phase relationship between a clock signal and a second signal, wherein measuring a voltage variation comprises measuring a difference between an instantaneous power supply voltage value and a filtered power supply voltage value.

4. The method of claim 3 wherein modifying the phase relationship comprises selecting a clock signal from a plurality of clock signals with varying phase relationships.

5. A method comprising:
   measuring a voltage variation on a power supply node using a power supply voltage measuring circuit including an analog-to-digital converter;
   in response to the voltage variation, modifying a phase relationship between a clock signal and a second signal, wherein modifying the phase relationship comprises interpolating a phase of the clock signal using a plurality of clock signals with varying phase;
   receiving the clock signal at an integrated circuit boundary;
   receiving the second signal at the integrated circuit boundary; and
   clocking the second signal with the clock signal.

6. An apparatus comprising:
   a power supply voltage measuring circuit comprising an analog-to-digital converter and a low pass filter to measure a voltage variation on a power supply node; and
   a clock circuit configured to be responsive to the voltage variation measured by the power supply voltage measuring circuit to vary a phase of a clock signal wherein the clock circuit comprises a delay lock loop to produce a plurality of clock signals with varying phase.

7. An apparatus comprising:
   a power supply voltage measuring circuit to measure a voltage variation on a power supply node, wherein the power supply voltage measuring circuit comprises an analog-to-digital converter; and
   a clock circuit configured to be responsive to the power supply voltage measuring circuit to vary a phase of a clock signal, wherein the clock circuit comprises a delay lock loop to produce a plurality of clock signals with varying phase, and an interpolator circuit configured to respond to the voltage variation measured by the power supply voltage measuring circuit to select a clock signal from the plurality of clock signals with varying phase.

8. An apparatus comprising:
a power supply voltage measuring circuit to measure a voltage variation on a power supply node, wherein the power supply voltage measuring circuit comprises an analog-to-digital converter; and
a clock circuit configured to be responsive to the power supply voltage measuring circuit to vary a phase of a clock signal, wherein the clock circuit comprises a delay lock loop to produce a plurality of clock signals with varying phase, and an interpolator circuit configured to respond to the voltage variation measured by the power supply voltage measuring circuit to produce a final clock signal by interpolating between various phases of the plurality of clock signals with varying phase.

9. An apparatus comprising:
a power supply voltage measuring circuit to measure a voltage variation on a power supply node, wherein the power supply voltage measuring circuit comprises an analog-to-digital converter;
a clock circuit coupled to the power supply voltage measuring circuit and configured to be responsive to the voltage variation measured by the power supply voltage measuring circuit to vary a phase of a clock signal, wherein the clock circuit is further configured to be responsive to the clocked data signal; and
a synchronous circuit to receive the clock signal and to produce a clocked data signal.

10. An apparatus comprising:
a power supply voltage measuring circuit to measure a voltage variation on a power supply node, wherein the power supply voltage measuring circuit comprises an analog-to-digital converter;
a clock circuit coupled to the power supply voltage measuring circuit and configured to be responsive to the voltage variation measured by the power supply voltage measuring circuit to vary a phase of a clock signal, wherein the control circuit comprises a lookup table to influence the clock circuit;
a synchronous circuit to receive the clock signal and to produce a clocked data signal; and
a control circuit coupled between the synchronous circuit, the power supply voltage measuring circuit, and the clock circuit.

11. An integrated circuit comprising:
a clock receiver;
a delay lock loop coupled to an output of the clock receiver;
a power supply voltage measuring circuit to measure a power supply voltage on a power supply node, wherein the power supply voltage measuring circuit comprises an analog-to-digital converter and a low pass filter coupled between the analog-to-digital converter and the power supply node; and
an interpolator responsive to a measurement of the power supply voltage performed by the power supply voltage measuring circuit to interpolate clock phases provided by the delay lock loop.

12. The integrated circuit of claim 11 further comprising:
a sampled receiver to receive data responsive to the interpolator; and
a control circuit to influence the interpolator responsive to the sample receiver and the power supply voltage measuring circuit.

13. An electronic system comprising:
a memory device to drive a first transmission line with a clock signal and a second transmission line with a second signal; and
an integrated circuit to receive the clock signal, to measure a power supply voltage value using power supply voltage measuring circuit, and to interpolate a phase of the clock signal in response to the power supply voltage value, wherein the power supply voltage measuring circuit comprises an analog-to-digital converter, and wherein the integrated circuit further comprises a delay lock loop coupled to an interpolator circuit to interpolate the phase of the clock signal.

14. The electronic system of claim 13 wherein the integrated circuit comprises a synchronous element to receive the second signal.

15. The electronic system of claim 13 wherein the integrated circuit further comprises a control circuit responsive to the power supply voltage value and the synchronous element, the control circuit configured to influence the interpolator circuit.

16. The electronic system of claim 15 wherein the control circuit includes a look-up table.

* * * * *